United States Patent
Irvin et al.

(10) Patent No.: US 8,440,496 B2
(45) Date of Patent: May 14, 2013

(54) SOLAR CELL WITH CONDUCTIVE MATERIAL EMBEDDED SUBSTRATE

(75) Inventors: Casey Scott Irvin, Los Angeles, CA (US); Vishal Shrotriya, El Monte, CA (US); Yue Wu, San Gabriel, CA (US)

(73) Assignee: Solarmer Energy, Inc., El Monte, CA (US)

( * ) Notice: Subject to any disclaimer, the term of this patent is extended or adjusted under 35 U.S.C. 154(b) by 60 days.

(21) Appl. No.: 12/499,460

(22) Filed: Jul. 8, 2009

(65) Prior Publication Data
US 2011/0008926 A1 Jan. 13, 2011

(51) Int. Cl.
*H01L 21/00* (2006.01)

(52) U.S. Cl.
USPC ............... 438/82; 438/50; 438/52; 438/73; 257/98; 257/103; 257/200; 257/E31.001

(58) Field of Classification Search ........... 438/73, 438/84, 65–66, 692, 82, 98, 50, 52; 257/E21.226, 257/347, 200, E31.126, 98, 103, E31.001
See application file for complete search history.

(56) References Cited

U.S. PATENT DOCUMENTS

| | | | |
|---|---|---|---|
| 3,589,946 A | 6/1971 | Tarneja et al. | |
| 4,060,426 A | 11/1977 | Zinchuk | |
| 4,104,084 A | 8/1978 | Evans, Jr. | |
| 4,252,573 A | 2/1981 | Boer et al. | |
| 4,400,868 A | 8/1983 | Antypas et al. | |
| 4,528,082 A | 7/1985 | Moustakas et al. | |
| 4,543,443 A | 9/1985 | Moeller et al. | |
| 4,574,160 A | 3/1986 | Cull et al. | |
| 4,586,988 A | 5/1986 | Nath et al. | |
| 4,590,327 A | 5/1986 | Nath et al. | |
| 4,595,790 A | 6/1986 | Basol | |
| 4,647,711 A | 3/1987 | Basol et al. | |
| 4,663,495 A | 5/1987 | Berman et al. | |
| 4,675,468 A | 6/1987 | Basol et al. | |
| 4,680,422 A | 7/1987 | Stanbery | |
| 4,686,323 A | 8/1987 | Biter et al. | |
| 4,695,674 A | 9/1987 | Bar-on | |
| 4,808,242 A | 2/1989 | Murata et al. | |

(Continued)

FOREIGN PATENT DOCUMENTS

| | | |
|---|---|---|
| EP | 0949850 | 10/1999 |
| GB | 2308182 | 6/1997 |

(Continued)

OTHER PUBLICATIONS

Li et al., Manipulating regioregular poly(3-hexylthiophene): [6,6]-phenyl-C61-butyric acid methyl ester blends-route towards high efficiency polymer solar cells, J. Mater. Chem., 2007, vol. 17, pp. 3126-3140.

(Continued)

*Primary Examiner* — Evan Pert
*Assistant Examiner* — Mark A Laurenzi
(74) *Attorney, Agent, or Firm* — Hema Vakharia-Rao; Nixon Peabody LLP

(57) ABSTRACT

Conductive material grids or lines embedded or partially embedded in a transparent substrate of a solar cell. The grids or lines can have a higher conductivity than the anode or they can have the same conductivity. The grids or lines increase the volume of the anode and, thus decrease sheet resistance of the same.

8 Claims, 7 Drawing Sheets

U.S. PATENT DOCUMENTS

| | | | |
|---|---|---|---|
| 4,865,999 | A | 9/1989 | Xi et al. |
| 5,069,727 | A | 12/1991 | Kouzuma et al. |
| 5,133,810 | A | 7/1992 | Morizane et al. |
| 5,176,758 | A | 1/1993 | Nath et al. |
| 5,181,968 | A | 1/1993 | Nath et al. |
| 5,288,338 | A | 2/1994 | Morikawa |
| 5,298,086 | A | 3/1994 | Guha et al. |
| 5,391,236 | A * | 2/1995 | Krut et al. ............... 136/249 |
| 5,458,694 | A | 10/1995 | Nuyen |
| 5,479,043 | A | 12/1995 | Nuyen |
| 5,558,723 | A * | 9/1996 | Ufert ............... 136/244 |
| 5,723,873 | A | 3/1998 | Yang |
| 5,797,998 | A | 8/1998 | Wenham et al. |
| 5,942,048 | A | 8/1999 | Fukisaki et al. |
| 6,121,542 | A | 9/2000 | Shiotsuka et al. |
| 6,278,055 | B1 | 8/2001 | Forrest et al. |
| 6,297,495 | B1 | 10/2001 | Bulovic et al. |
| 6,320,117 | B1 | 11/2001 | Campbell et al. |
| 6,352,777 | B1 | 3/2002 | Bulovic et al. |
| 6,420,031 | B1 | 7/2002 | Parthasarathy et al. |
| 6,469,437 | B1 | 10/2002 | Parthasarathy et al. |
| 6,509,204 | B2 | 1/2003 | Campbell |
| 6,515,030 | B1 | 2/2003 | Bechtel |
| 6,538,194 | B1 | 3/2003 | Koyanagi et al. |
| 6,657,378 | B2 | 12/2003 | Forrest et al. |
| 6,913,943 | B2 | 7/2005 | Cunningham et al. |
| 6,936,761 | B2 | 8/2005 | Pichler |
| 7,022,910 | B2 | 4/2006 | Gaudiana et al. |
| 7,105,237 | B2 | 9/2006 | Sotzing |
| 7,163,831 | B2 | 1/2007 | Hasegawa et al. |
| 7,737,356 | B2 | 6/2010 | Goldstein |
| 2002/0009015 | A1 | 1/2002 | Laugharn |
| 2004/0099307 | A1 | 5/2004 | Sun |
| 2004/0113546 | A1 | 6/2004 | Forrest et al. |
| 2004/0265623 | A1 | 12/2004 | Stegamat et al. |
| 2005/0126629 | A1 | 6/2005 | Okada et al. |
| 2005/0150543 | A1 | 7/2005 | Nakashima et al. |
| 2005/0164019 | A1 | 7/2005 | Liu et al. |
| 2005/0205127 | A1 | 9/2005 | Watanabe et al. |
| 2005/0260777 | A1 | 11/2005 | Brabec et al. |
| 2005/0268962 | A1 | 12/2005 | Gaudiana et al. |
| 2005/0275340 | A1 | 12/2005 | Choi et al. |
| 2006/0000506 | A1 | 1/2006 | Brabee et al. |
| 2006/0065301 | A1* | 3/2006 | Miyoshi ............... 136/263 |
| 2006/0071200 | A1 | 4/2006 | Nordquist et al. |
| 2006/0090791 | A1 | 5/2006 | Gaudiana et al. |
| 2006/0141662 | A1 | 6/2006 | Brabec et al. |
| 2006/0175962 | A1* | 8/2006 | Fujimoto et al. ............... 313/506 |
| 2006/0234065 | A1 | 10/2006 | Ohno et al. |
| 2006/0292736 | A1 | 12/2006 | Lee et al. |
| 2007/0000537 | A1 | 1/2007 | Leidholm et al. |
| 2007/0028959 | A1 | 2/2007 | Lee et al. |
| 2007/0044836 | A1 | 3/2007 | Forrest et al. |
| 2007/0068569 | A1 | 3/2007 | Nam et al. |
| 2007/0079869 | A1 | 4/2007 | Yukinobu |
| 2007/0095389 | A1 | 5/2007 | Cho et al. |
| 2007/0095391 | A1 | 5/2007 | Sun |
| 2007/0131277 | A1 | 6/2007 | Gaudiana et al. |
| 2007/0178619 | A1 | 8/2007 | Forrest et al. |
| 2007/0181179 | A1 | 8/2007 | Brabec et al. |
| 2007/0184576 | A1 | 8/2007 | Chang et al. |
| 2007/0186971 | A1 | 8/2007 | Lochun et al. |
| 2007/0190789 | A1* | 8/2007 | Carter et al. ............... 438/692 |
| 2007/0193621 | A1 | 8/2007 | Brabec et al. |
| 2007/0193622 | A1 | 8/2007 | Sai |
| 2007/0215879 | A1 | 9/2007 | Liu et al. |
| 2007/0216300 | A1 | 9/2007 | Lee et al. |
| 2007/0235074 | A1 | 10/2007 | Henley et al. |
| 2007/0246704 | A1 | 10/2007 | Heeney et al. |
| 2007/0251570 | A1 | 11/2007 | Eckert et al. |
| 2007/0267055 | A1 | 11/2007 | Gaudiana et al. |
| 2007/0272296 | A1 | 11/2007 | Brabec et al. |
| 2007/0295387 | A1 | 12/2007 | Adriani et al. |
| 2008/0006324 | A1 | 1/2008 | Berke et al. |
| 2008/0029147 | A1 | 2/2008 | Yang et al. |
| 2009/0223079 | A1* | 9/2009 | Myong ............... 34/274 |
| 2009/0229667 | A1 | 9/2009 | Shrotriya et al. |
| 2009/0269621 | A1 | 10/2009 | Lifka et al. |
| 2010/0018581 | A1 | 1/2010 | Shrotriya et al. |
| 2010/0276071 | A1 | 11/2010 | Li et al. |
| 2010/0290879 | A1 | 11/2010 | Wu et al. |
| 2011/0017956 | A1 | 1/2011 | Hou et al. |

FOREIGN PATENT DOCUMENTS

| | | | |
|---|---|---|---|
| JP | 2000-077708 | * | 3/2000 |
| WO | WO 93-21662 | | 10/1993 |
| WO | WO 2004-112161 | | 12/2004 |
| WO | WO 2006-133265 | | 12/2006 |
| WO | WO 2007-005617 | | 1/2007 |
| WO | WO 2007-070395 | | 6/2007 |
| WO | WO 2008-016691 | | 2/2008 |
| WO | WO 2009-114832 | | 9/2009 |
| WO | WO 2010-008456 | | 1/2010 |
| WO | WO 2011-011545 | | 1/2011 |
| WO | WO 2011-057191 | | 5/2011 |

OTHER PUBLICATIONS

PCT Search Report and Written Opinion mailed Sep. 15, 2010 for PCT/US10/42794.

International Search Report for International Application No. PCT/US2009/037197, dated Oct. 29, 2009.

International Search Report for International Application No. PCT/US2010/055829, dated Jan. 10, 2011.

International Preliminary Examination Report for International Application No. PCT/US2009/037197, dated Sep. 23, 2010.

Office Action for U.S. Appl. No. 12/179,387, dated Jul. 12, 2010, 10 pages.

Office Action for U.S. Appl. No. 12/049,252, dated May 27, 2010, 33 pages.

Office Action for U.S. Appl. No. 12/049,252, dated Dec. 1, 2009, 25 pages.

Office Action for U.S. Appl. No. 12/049,252, dated Dec. 27, 2010, 40 pages.

J. Huang, et al., "Achieving High-Efficiency Polymer White-light-Emitting Devices", Advanced Materials 2006, vol. 18, pp. 114-117.

G. Li, et al., "High-Efficiency Solution Processable Polymer Photovoltaic Cells by Self-Organization of Polymer Blends", Nature Materials, Nov. 2005, vol. 4, pp. 864-868.

V. Shrotriya, et al., "Efficient light Harvesting in Multiple-Device Stacked Structure for Polymer Solar Cells", Applied Physics Letters 88,064104.

V. Shrotriya, et al., "Transition Metal Oxides as the Buffer Layer for Polymer Photovoltaic Cells", Applied Physics Letters 88, 073508.

G. Li, et al., "Efficient Inverted Polymer Solar Cells", Applied Physics Letters 88, 253503.

C. Chu, et al., "Integration of Organic light-Emitting Diode and Organic Transistor Via a Tandem Structure", Applied Physics Letters 86, 253503.

H. Liao, et al., "Highly Efficient Inverted Polymer Solar Cell by Low Termperature Annealing of CS2C03 Interlayer", Applied Physics Letters 92, 173303.

V. Shrotriya, et al., Translucent Plastic Solar Cells—Novel Devices and Their Applications, Conference, USA 2007.

Office Action for U.S. Appl. No. 12/179,387, dated Mar. 7, 2011, 12 pages.

* cited by examiner

SOLAR CELL WITH CONDUCTIVE MATERIAL EMBEDDED SUBSTRATE

BACKGROUND

1. Field

The present disclosure relates to organic solar cells.

2. General Background

Solar cells based on organic materials and polymers have attracted research interest and are considered promising alternatives to their inorganic counterparts. Among their attractive features, they are low-cost, flexible, have low-energy consumption in production, incorporate high-throughput processing technologies, they are aesthetically pleasing, and are versatile for many applications.

SUMMARY

Conductive material grids or lines embedded or partially embedded in a transparent substrate of a solar cell. The grids or lines can have a higher conductivity than the anode or they can have the same conductivity. The grids or lines increase the surface area and volume of the anode and, thus decrease sheet resistance of the same.

In one instance, a method for fabricating an electrode of an organic solar cell is disclosed. The method comprises depositing a transparent electrode onto a transparent substrate. Trenches are cut into the substrate and deposited transparent electrode. The trenches have a length, a width and a height and the height is preferably larger than the width. The trenches are filled with a conducting material to the level of the transparent electrode.

In another instance, a method for fabricating an electrode of an organic solar cell is disclosed. The method comprises cutting trenches into a transparent substrate. The trenches have a length, a width and a height. A transparent electrode is deposited on the substrate such that it fills the trenches and covers the top of the transparent substrate. The transparent electrode can be deposited by solution processing. If the transparent electrode is deposited by thermal evaporation or sputtering, the method may further comprise polishing the transparent electrode so that the transparent electrode is substantially smooth.

In another instance, a method for fabricating an electrode of an organic solar cell is disclosed. The method comprises cutting trenches into a transparent substrate. The trenches have a length, a width and a height. A metal is deposited to fill the trenches leaving an area of the substrate exposed and such that the metal rises above the surface of the substrate. A transparent electrode is deposited onto the substrate and metal filled trenches such that the transparent electrode electrically connects the metal filled trenches and covers the area of the substrate exposed between trenches.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Figure 1:
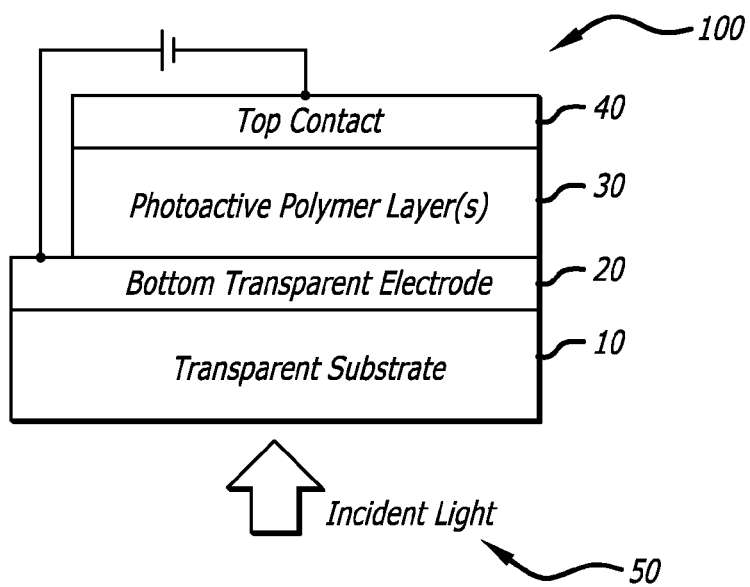
FIG. 1 is an exemplary embodiment of a transparent solar cell.

Referring to FIG. 1, there is an organic solar cell 100. The organic solar cell 100 has a substrate 10 and bottom electrode 20 that are transparent. The transparency allows light 50 to transmit though the substrate 10 and bottom electrode 20 to the following photoactive layer(s) 30. The bottom electrode 20 also acts as a charge collection layer for charges generated in the photoactive layer(s) 30.

Polymer photoactive layers used in plastic solar cells are usually about 50-200 nm thick. This small thickness results in inefficient absorption because maximum absorption wavelength for a polymer active layer is usually about 650 nm. For example, maximum absorption in a 80 nm thick poly(3-hexylthiophene): [6,6]-phenyl $C_{61}$-butyric acid methyl ester (P3HT:PCBM) film, the most commonly used active layer, has been shown to be less than 40% at the peak absorption wavelength. At other wavelengths in the absorption range an even higher percentage of light is transmitted without being absorbed.

The active layer of organic or plastic solar cells is semi-transparent or translucent in the visible light range. In order to make the plastic solar cells transparent, the bottom and top contacts have to be made transparent. The photons that are unabsorbed in the active layer should be transmitted through the cell, without any significant reduction in intensity.

The following processes can be utilized to fabricate an organic or plastic solar cell in accordance with the present disclosure:

Thermal annealing: Thermal annealing is a process in which the substrates, which have various layers deposited on top, are provided thermal energy (heat) by placing the substrates on a hot plate, which is maintained at a certain temperature for a certain period of time. The temperature is referred to as the annealing temperature and the time as annealing time. The thermal annealing may also be done by providing the thermal energy in non-contact mode where the substrate does not come in contact with the hot plate (or heat source), such as placing the substrates in an oven under controlled temperature for a certain period of time.

Solvent annealing: Solvent annealing is a process where an organic layer, which has been deposited on top of a substrate with a bottom contact, is allowed to solidify at a controlled slow rate to enhance the self-organization in the organic polymer film. This is achieved by dissolving the organic polymer(s) in a high boiling point solvent, such as dichlorobenzene or tricholorobenzene, for depositing the organic polymer film by solution processing. Due to the high boiling point of the solvent, the film is usually wet after it is deposited, which is then allowed to dry in a controlled manner to slow down the time it takes for the film to convert from liquid phase to solid phase. The desired solidification time is between 2 to 20 minutes. The longer solidification time allows the polymer chains in film to align in a highly-ordered crystalline phase which may result in increased efficiency of photovoltaic conversion in the film.

Adding additives to enhance carrier mobility: Adding additives is a technique used in polymer solar cells to improve the morphology and enhance the carrier mobility. One example is adding slight amount of poor solvent(s) (e.g. alkanedithiols, or nitrobenzene) into the dominant solvent used to make polymer solution (e.g. chlorobenzene or dichlorobenzene). Improved polymer aggregation and crystallinity has been achieved in some polymer systems and so has enhanced carrier mobility. Another example is the addition of electrolytes and salt into polymer blend solutions, which is also shown to improve photocurrent in polymer solar cells.

Thermal evaporation: Thermal evaporation is a common technique, one of the physical vapor deposition (PVD) methods, to deposit thin film materials. In thermal evaporation, the material is heated in a vacuum of $10^{-5}$ to $10^{-7}$ Torr range until it melts and starts evaporating. The vapor then condenses on a substrate exposed to the vapor, which is kept at a cooler temperature to form a thin film. The materials are heated by placing them in a crucible (or boat) which is made of high electrical resistance material such as tungsten, and passing high current through the boat.

The active layer(s) or photoactive layer(s) 30 are typically a bulk-hetero-junction (BHJ) of a p-type donor polymer and an n-type acceptor material. Photons are absorbed in the donor polymer and excitons are generated when the photons are absorbed. The excitons migrate to the donor-acceptor interface, where they are dissociated into free electrons and holes, which are then transported through a 3-dimensional (3-D) interpenetrated network of donors and acceptors in the BHJ film and are collected at the contacts.

Many polymers can be used as the donor polymer in the BHJ film, such as P3HT, poly[2-methoxy-5-(3,7-dimethyloctyloxy)-1,4-phenylene vinylene] (MDMO-PPV), or poly(2-methoxy-5-(2'-ethyl-hexyloxy)-1,4-phenylene vinylene) (MEH-PPV). Other low-band-gap polymers can be used for the active layer as well.

Common acceptor material candidates are PCBM or [6,6]-phenyl $C_{71}$-butyric acid methyl ester ($C_{70}$-PCBM). Other materials such as single-walled carbon nanotubes (CNTs) and other n-type polymers can also be used as the acceptor material.

The active layer can be obtained by spin-coating from polymer solution in organic solvent(s). The film can also be obtained by several other solution processing techniques, such as bar-coating, inkjet-printing, doctor-blading, spray coating, screen printing and others known in the art. By using such techniques, a large area of substrate can be covered by a polymer solution with ease and at low costs. Also, flexible substrates can be used to substitute glass or plastic, resulting in a translucent and flexible plastic solar cell.

To improve the photovoltaic conversion efficiency of a plastic solar cell, the BHJ film may undergo different treatments. For example, in a P3HT:PCBM system, both solvent annealing and thermal annealing can be used. In the solvent annealing approach, the slow solidification rate of the photoactive layer(s) allows the P3HT polymer chains to be organized into a highly ordered crystalline state, which improves the absorption of light within the polymer, enhances the charge carrier mobility, improves the exciton generation and dissociation efficiency, and results in a highly balanced charge carrier transport. Due to these effects the efficiency of plastic solar cells can be enhanced significantly. Thermal annealing has also been used to partially recover the polymer crystallinity which also improves solar cell performance. Other possible approaches may include solvent mixing, where two or more solvents are used to dissolve the polymer blend or by adding an ionic salt into the photoactive layer(s), as well as other potential interfacial layer modifications known in the art.

A transparent conductive oxide (TCO) including but not limited to indium tin oxide (ITO) or fluorinated tin oxide (FTO) can be deposited on a coated glass (or plastic) substrates to form the anode or bottom electrode or bottom contact 20. The TCO films are obtained by solution processing, sputtering or thermal spray-coating. To enhance the performance of the organic solar cells, the TCO covered glass surface is coated with a conducting polymer, such as poly(ethylenedioxythiophene): poly(styrenesulfonate) (PEDOT:PSS), or polyaniline (PANI).

In another variation, to form the bottom transparent electrode 20, the TCO can be covered with a transition metal oxide (TMO), such as vanadium pentoxide ($V_2O_5$), molybdenum oxide ($MoO_3$), or tungsten oxide ($WO_3$). In this case, the metal oxide can be either thermally evaporated or deposited through solution processes directly on top of TCO glass substrates. The TMO layer, with a thickness of 3-20 nm, can replace PEDOT:PSS in the polymer solar cells without effecting the performance since it is transparent and reasonably conductive. The efficiency of polymer solar cells with a TCO/TMO bottom contact is comparable to or even better than those with a ITO/PEDOT:PSS bottom contact. Using TMO as the anode interfacial layer also prevents the unwanted chemical reaction between ITO and PEDOT:PSS, which can cause performance degradation resulting in poor organic solar cell lifetime.

Conductive polymers, such as PEDOT:PSS or PANI, can substitute the TCO layer as the bottom transparent electrode 130. Since conducting polymers can be solution processed, this method results in an easy and low cost process that gets rid of high temperature deposition process such as sputtering of TCOs. However, the conductivity of even highest conductivity PEDOT is only about 100 S/cm, which is about an order of magnitude lower than that of ITO. To achieve efficient charge collection, the conductivity must be improved. To overcome this deficiency, very fine metal lines or mesh can be embedded into the PEDOT:PSS or PANI film to provide high surface conductivity and efficient charge collection at the interface. The metal lines can be thermally evaporated on top of glass substrates though a photo-mask prepared by photo-lithography. Several high conductivity metals such as aluminum (Al), gold (Au), silver (Ag), copper (Cu), chromium (Cr) coated with Au, etc. can be used for metal lines. The high conductivity polymer film can be deposited from aqueous solution on glass or plastic substrates covered with metal lines, evaporated on top of the glass substrates, by using solution processing techniques, such as spin-coating, bar-coating, inkjet-printing, doctor-blading, spray coating, screen printing or other techniques known in the art.

The top electrode is often 100-200 nm in thickness and is opaque but can also be made to be 10-25 nm in thickness and transparent. If the top contact or cathode 40 in is transparent, it can allow the light that is not absorbed by the photoactive layer(s) 30 to be transmitted though the solar cell 100. At the same time, the top contact also enables efficient electron collection at the cathode-polymer interface at the same time.

One of the methods for obtaining a transparent cathode 110 is thermally evaporating multi-layered metals films. Such multi-layered metal films include: (i) lithium fluoride (LiF) and Au, (ii) LiF and Al, (iii) calcium (Ca) and Au, and (iv) LiF, Al, and Au. The total thickness of the multi-layered metal cathode is about 10-12 nm. The metal films are evaporated under high vacuum in succession. The transmittance of metal electrode is about 80-85%.

In one instance, a semi-transparent top electrode is obtained is by spin-coating a thin layer of n-type material such as cesium carbonate, calcium acetylacetonate [Ca(acac)$_2$], cesium fluoride (CsF), CNTs, followed by evaporating a thin layer of transparent metal such as Ag or Au. The thickness of the metal layer, in this case, would be about 15 nanometers or less.

Another way to obtain a semi-transparent top electrode is to spin-coat a thin layer of n-type material such as cesium carbonate, calcium acetylacetonate [Ca(acac)$_2$], cesium fluoride (CsF), CNTs, etc. followed by depositing a transparent conducting oxide layer, such as ITO or FTO, by sputtering or thermal spray-coating to form the semi-transparent top electrode.

Transparent conducting oxides such as indium tin oxide (ITO), fluorine doped tin oxide (FTO), conducting polymers, carbon nanotubes, and others have been used as the bottom electrode. The thickness of the transparent electrodes such as ITO is usually a few hundred nanometers to allow good transparency (above 80% or more) and low resistivity. Both good transparency and low resistivity are important features to achieve high photovoltaic efficiency. The surface resistivity of the ITO films are typically 1-100Ω/□ which is high, especially as the cells increase in surface area. As the size of the cell becomes larger, the fill factor of the cell becomes lower as a result of this relatively high surface resistance. This contributes to the overall series resistance of the solar cell and resulting in lower efficiency.

Figure 3:
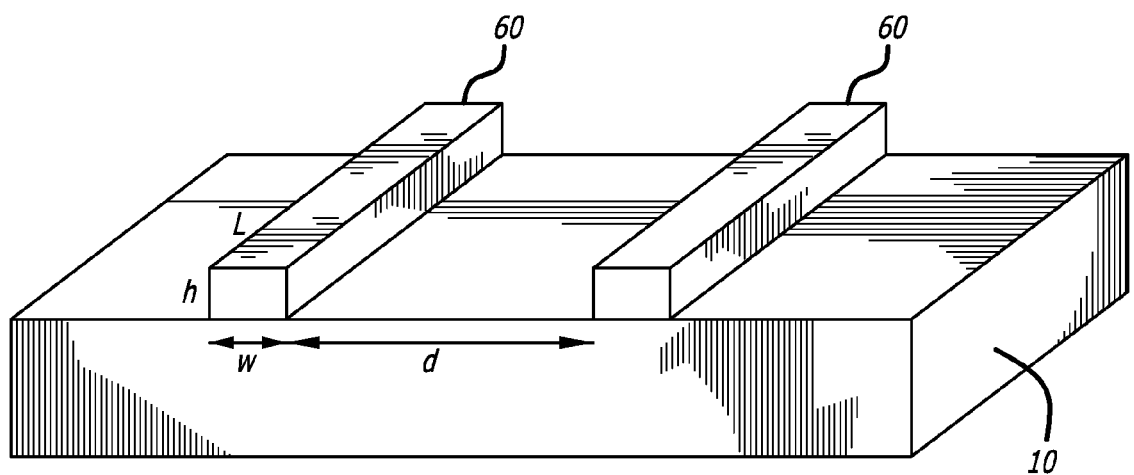
FIG. 3 is a perspective view of an exemplary embodiment of a transparent solar cell with a conductive grid.
Figure 4:
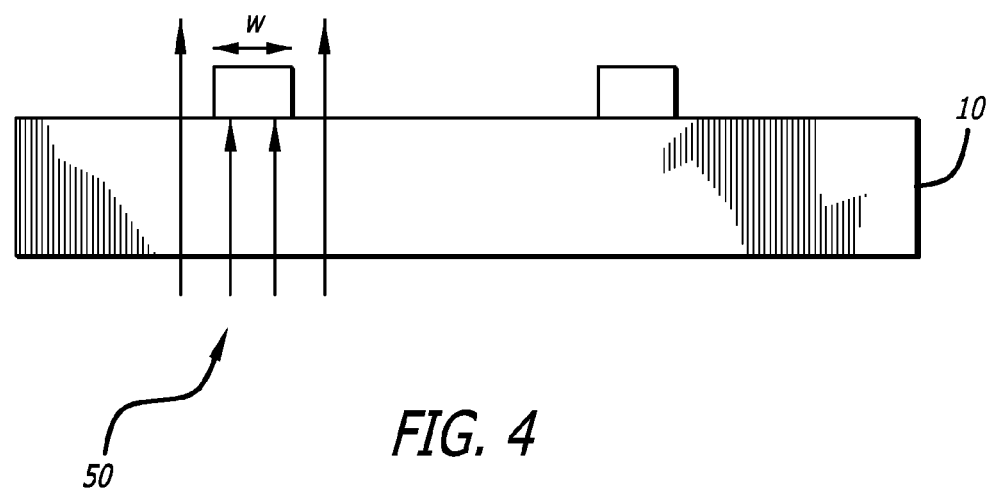
FIG. 4 is a side view of an exemplary embodiment of a transparent solar cell with a conductive grid.

Referring to FIGS. 3-4, to increase the conductivity of the anode layer or bottom electrode 20, grid or lines 60 of conductive metals have been deposited on top of the anode layer 20. The conductivity of the deposited materials that form the grid or lines 60 is significantly higher relative to the transparent electrode, which results in an overall increase in the conductivity of the electrode surface.

The problem with this approach is maintaining a balance between the increase in conductivity and the reduction in incident light 50 due to the presence of grids or lines 60 on the electrode 20 surface, since the metal grid or lines 60 will be opaque and block the light 50 that reaches the photoactive layer(s) 30 as shown in FIG. 3. Therefore, a grid or lines that maximize the cross sectional area (H*W in FIG. 3) of the grid or lines 60 while minimizing the amount of area on the surface (W*L) of the substrate 10 is proposed.

Figure 2:
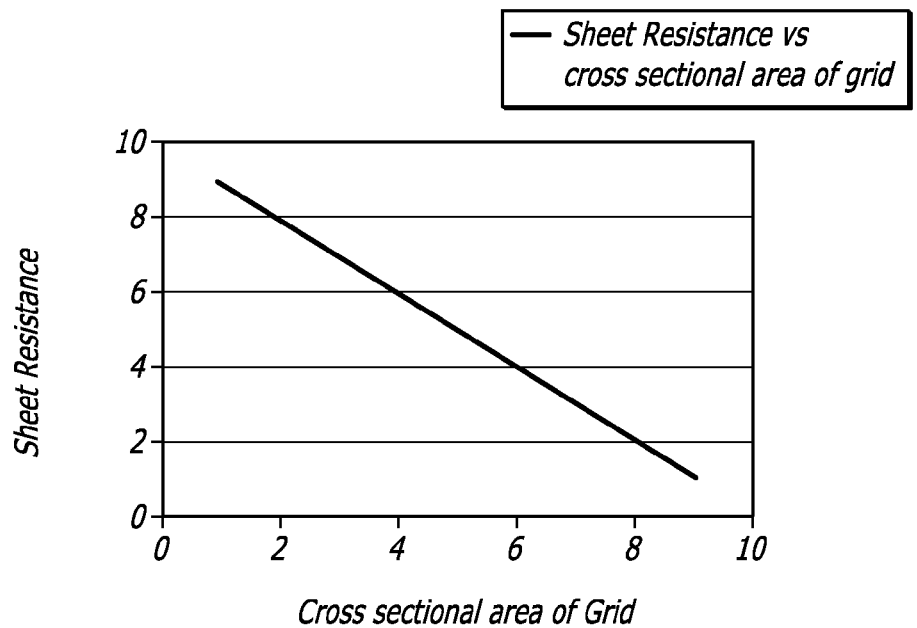
FIG. 2 is a graph showing a relationship between sheet resistance versus cross-sectional area of a conductive grid.

For a given material, and a given pattern with a certain length of grid, the resistance is directly proportional to the cross sectional area of the grid or lines 60. The conductive grid or lines 60 have a cuboidal cross section. Conductance of the cuboidal is defined as: $G=A/\rho.L$, where, $\rho$ is the bulk resistivity of the material, L is the length and A is the cross section area defined as the height (h) multiplied by the width (w), $A=hw$. This linear relationship is shown in FIG. 2.

The conductive grid or lines 60 include a height (h) that is larger than the width (w) and are positioned on top of the substrate 10. The larger the width (w), the more light 50 is blocked, therefore, to increase the surface area of the conductive grid or lines 60 while blocking as little light 50 as possible, the height (h) must be increased.

In order to increase the conductance, or reduce the resistance, the cross section area A has to be maximized for a given L and $\rho$. When an opaque element such as grid or lines 60 is deposited on a transparent substrate 10 with or without an anode 20, it blocks some of the incident light 50 reaching the photoactive layer(s) 30 by removing the area equivalent to (L.w) from the total usable surface area of the substrate 10 for each line 60. Therefore, even though the presence of grid increases the efficiency of the PV cell by increasing the conductance of the anode 20 by increasing charge collection, its presence reduces the amount of light 50 transmitted to the active layer 30, which also reduces the efficiency of the cell.

This puts a limit on the width (w) of the cuboidal for which the grid or lines 60 would still have a net benefit to the performance of the cell. Typically, the width (w) is about ⅟₁₀th of the spacing (d) between the individual lines, or lower, so that it only covers less than about 10% of the total surface area. Therefore, in order to increase the cross section area A, the height h has to be increased. However, in a typical organic solar cell, the total thickness of the photoactive layer 30 is only few hundred nanometers (50-300 nm). Which means that the height of the grid or lines 60 cannot be more than 50-300 nm. Otherwise, the grid or lines 60 would touch the top electrode 40 and short circuit the cell or result in a significant surface roughness in the active layer 30 deposited on the substrate 10, which would likely cause defects in the film and reduces the efficiency of the cell.

Therefore, high conductivity material grids or lines 60 are embedded in the transparent substrate 10 of the solar cell as well as in any transparent conductive anode 20 located on the transparent substrate 10 to increase the surface are of the anode 20.

Figure 5:
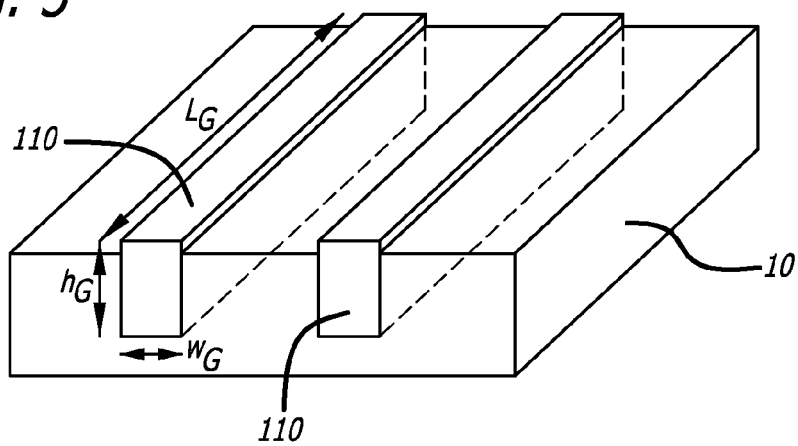
FIG. 5 is a perspective view of an exemplary embodiment of a transparent solar cell with a grid or lines embedded in a substrate

Referring to FIG. 5, there are grids or lines 110 partially embedded into the substrate 10. The space in the substrate 10 occupied by the grids or lines 110 is previously unused, and by making the grids with a relatively narrow width $W_G$ and relatively large depth $H_G$ increases the conductivity of the bottom electrode (not shown in FIG. 5), to which the grid or lines 110 are connected. Preferably, the grid or lines 110 are as thin as possible and are completely or almost completely embedded in the substrate 10 instead of on top of the substrate 10 or partially in the substrate 10.

As an example, the grid or lines 110, shown in the FIG. 5, can be 10 μm wide and up 0.5 mm deep (500 μm), which results in a cross section of 5000 μm². Such a configuration should lead to a significant increase in the conductivity of the grid by significantly decreasing the sheet resistance of the bottom electrode 20. The present example blocks a 10 µm$^2$ area of light per grid per unit length, resulting in a cross section that is 500 times larger while reducing the light blocking area by 10 times. The conductivity of the bottom electrode is proportional to the cross section of the conductor. Other patterns, such as two sets of parallel lines, orthogonal to each other, can also be used.

Figure 6A:
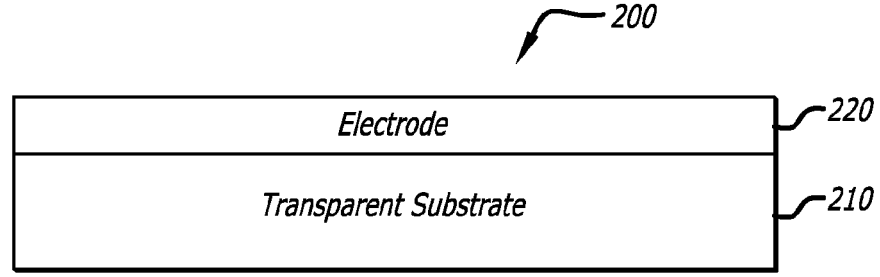
FIG. 6a is an exemplary embodiment of a transparent substrate and electrode in a side-view before trenches have been cut.
Figure 6B:
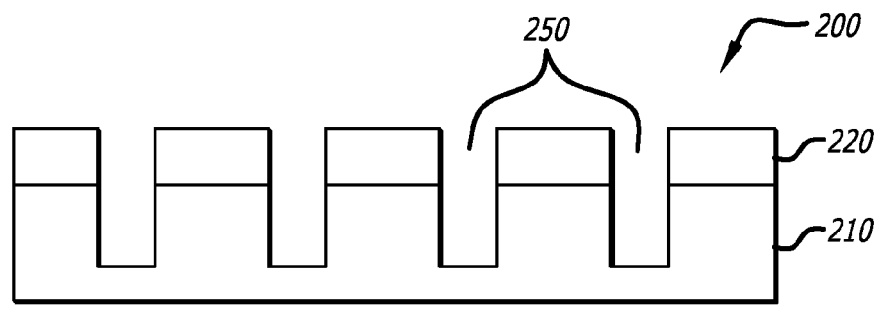
FIG. 6b is an exemplary embodiment of a transparent substrate and electrode after the trenches have been cut.
Figure 6C:
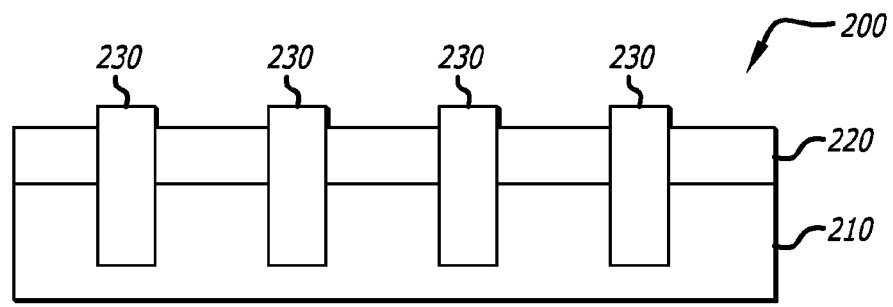
FIG. 6c is an exemplary embodiment of a transparent substrate and electrode after the trenches have been cut and a conducting material has been deposited in the trenches.
Figure 7:
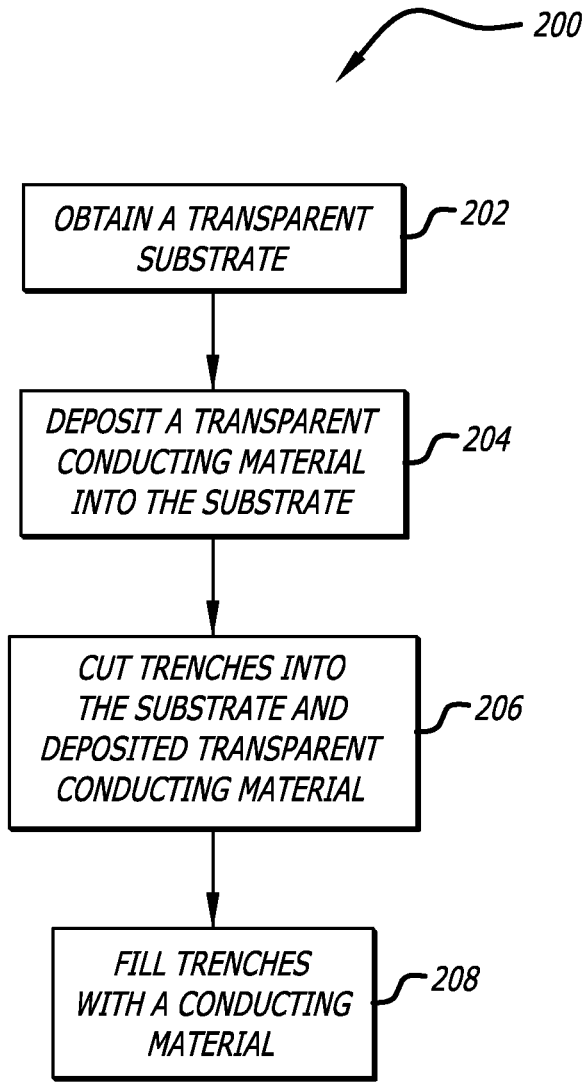
FIG. 7 is a process flow diagram of a method for fabricating an electrode of a solar cell.

A method 200 for fabricating an electrode of an organic solar cell is shown in FIGS. 6a-7, in accordance with the present disclosure. FIGS. 6a-6c shows a step by step pictorial representation of the method 200 and FIG. 7 represents the method as a flow diagram.

In operation 202, a substrate 210 which can be glass, PET or PEN or any other transparent substrate known in the art, is obtained. Shown in FIG. 6a, the substrate 210 is coated with a transparent electrode 220 such as TCO, a high conductivity polymer, Carbon nanotubes (CNT) or others known in the art in operation 204. The transparent electrode 220 has a thickness that is less than about 300 nm and/or has a transmittance of 70% or more. The electrode 220 can be deposited by thermal evaporation, sputtering or solution process.

Trenches 250 are cut into the transparent electrode 220 and transparent substrate 210 in a pattern, such as an array of parallel lines, by laser ablation, chemical etching or mechanical removal technique in operation 206. As shown in FIG. 6b, the trenches 250 are relatively thin (1-50 microns for example) and relatively deep (50-500 microns for example). The depth of the trenches 250 will be less than the thickness of the substrate 210, which is typically less than about 1 mm for glass and about 10 mm or less for flexible substrates such as PET or PEN. The width of the trenches ($W_G$) is preferably 10% or less (but can be higher) of the spacing between the trenches 250. The width and the depth of the trenches 250 are selected so that once filled with conductive grid material, a net gain in surface conductivity of the electrode 220 will result with the grid or lines 210. There is also a net increase in solar cell efficiency when the loss due to blocked or reduced light is compared to the increase due to lower sheet resistance and hence higher fill factor or the total power per area generated due to larger cells being made with the same fill factor as compared to smaller cells without embedded grids.

In FIG. 6 the grids have a rectangular cross section, but can also be circular, elliptical or any other shape. The trenches of the present disclosure are grooves or channels dug or cut into the surface of a substrate. The grooves or channels are in an area of the solar cell that is typically unused.

The trenches 250 are filled with conductive material in operation 208. The conductive material can have the same, similar or higher conductivity than the material of the electrode 220 and can be either transparent or opaque. The material can be a metal such as (Al, Cu, Au, Ag, and the like), or the material can be graphene, ITO, a high conductivity polymer, carbon nanotubes or other materials with similar properties.

The grids or lines 210 should fill the trenches 250 to the level of the surface of the transparent electrode 220 or up to a height $h_s$ above the top most surface. The grid material can be deposited by physical vapor deposition such as thermal evaporation and sputtering or by digital printing such as spray coating and inkjet printing. The grid or lines 210 could also be a pre-formed structure placed in the trenches 250. Additionally, if the conductive material of the grid or lines 210 is deposited by solution processing, the solar cell may require sintering or thermal annealing.

In order to keep the conductive material from getting on areas of the substrate 210 that it is not desired, the conductive material can be deposited into the trenches by masking.

Another technique is digital spray printing, where a stream of conductive metal paste is sprayed into the trenches 250 directly without depositing it on the peripheral area. In the event the conductive material is deposited outside the trenches 250, the surface of the substrate 210 can be polished to remove the conductive material in undesired locations and to leave the portion inside the trenches 250.

In one instance, it may be desirable to have the grid or lines 230 extend above the top surface of the electrode 220.

Figure 8A:
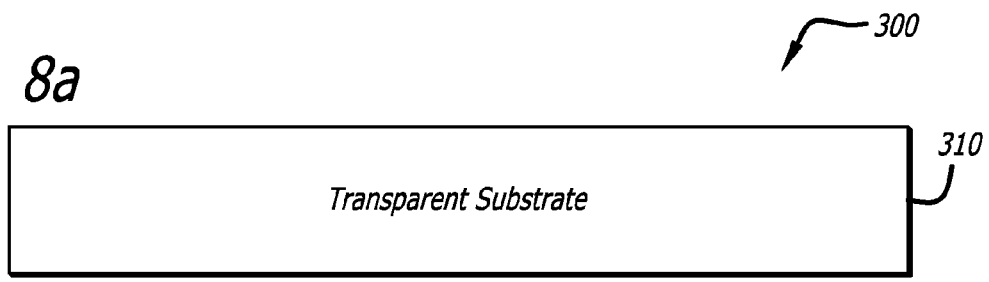
FIG. 8a is an exemplary embodiment of a transparent substrate in a side-view before trenches have been cut.
Figure 8B:
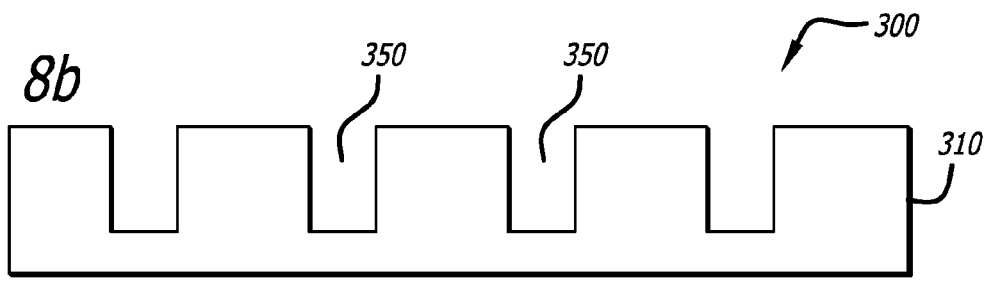
FIG. 8b is an exemplary embodiment of a transparent substrate after the trenches have been cut.
Figure 8C:
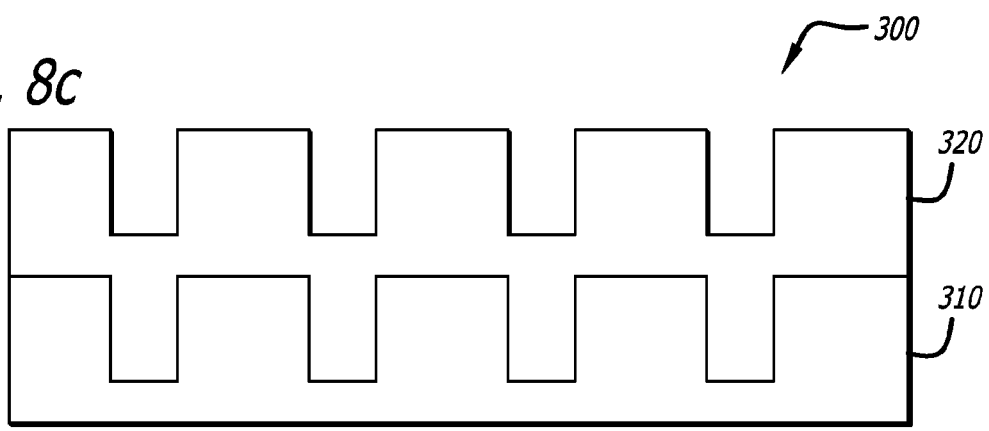
FIG. 8c is an exemplary embodiment of a transparent substrate after the trenches have been cut and after a transparent electrode has been deposited.
Figure 8D:
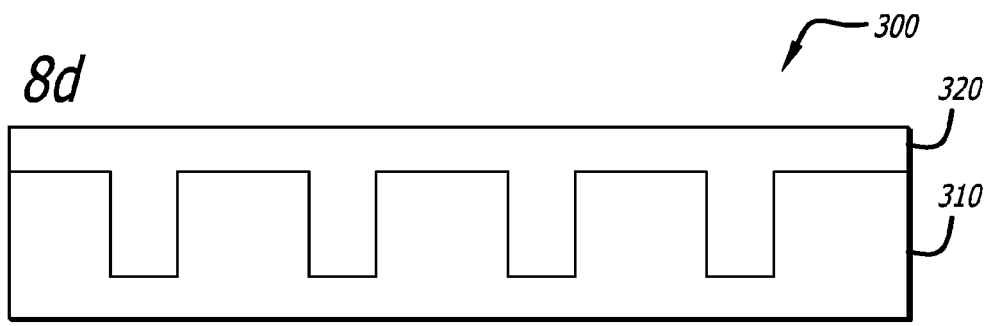
FIG. 8d is an exemplary embodiment of a transparent substrate after the trenches have been cut and after a transparent electrode has been deposited and polished.
Figure 9:
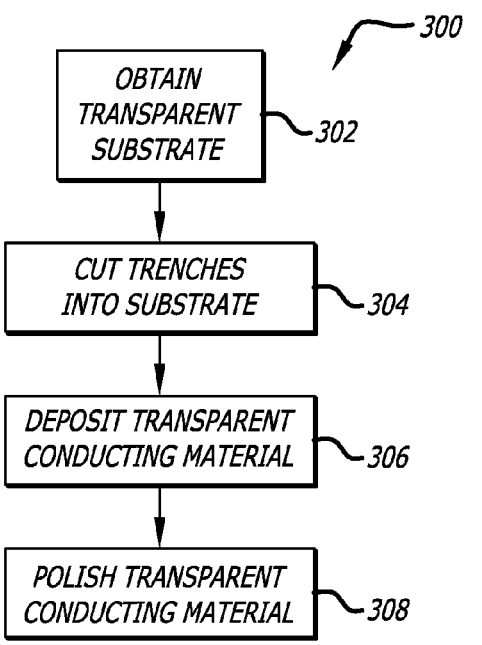
FIG. 9 is a process flow diagram of a method for fabricating an electrode of a solar cell.

A method 300 for fabricating an electrode of an organic solar cell is shown in FIGS. 8a-9, in accordance with the present disclosure. FIG. 8a-8d shows a step by step pictorial representation of the method 300 and FIG. 9 represents the method as a flow diagram.

In operation 302, a substrate 310 without a transparent electrode coated on top is obtained. Trenches 350 are cut in substrate 310 in the same manner as described above for method 200 in operation 304. A transparent conducting material, such as TCO, is deposited onto the surface of the substrate 310 to make the transparent electrode 320 in operation 306. As shown in FIG. 8c, the transparent electrode 320 fills the trenches 350 completely and rises above the original substrate surface by a height $h_s$ in the areas where the trenches 350 were. If a physical vapor deposition technique is used to deposit the electrode 320, the resulting layer will follow the contours of the substrate 310 and it will look like what is shown in FIG. 8c. The surface of the electrode 320 is then polished in operation 308, leaving a flat surface as shown in FIG. 8d, where the transparent electrode 320 has a height $h_s$ above the substrate 310. In this instance, 100% of the surface area of the substrate 310 is available for energy conversion, although transparency at the thicker electrode regions, the regions where the trenches 350 are filled with the transparent conducting material, is lower.

However, if the transparent electrode 320 is deposited by a solution process, the resulting electrode 320 may not follow the contours of the substrate 310 and a polishing step may not be required.

Figure 10A:
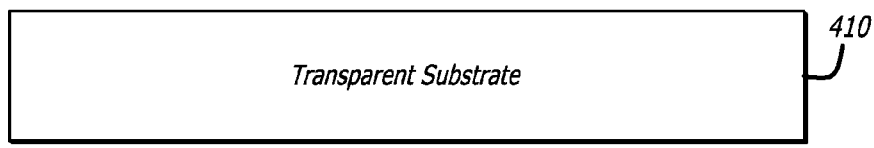
FIG. 10a is an exemplary embodiment of a transparent substrate in a side-view before trenches have been cut.
Figure 10B:
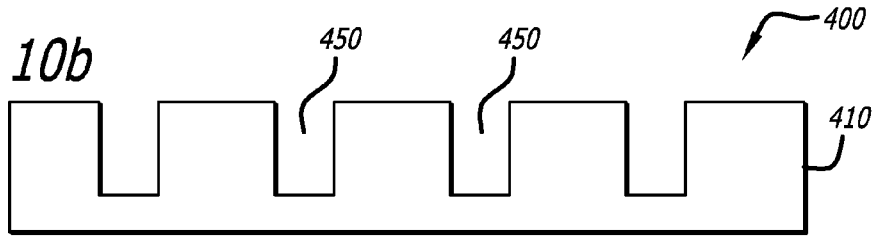
FIG. 10b is an exemplary embodiment of a transparent substrate after trenches have been cut.
Figure 10C:
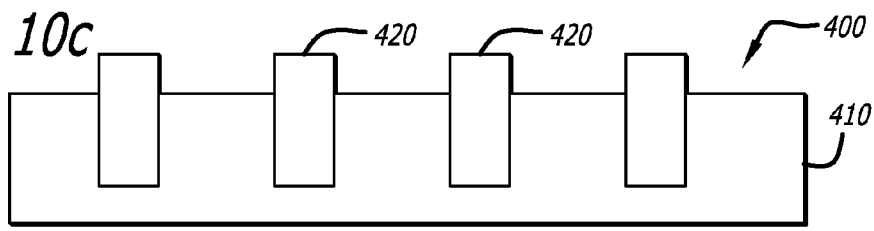
FIG. 10c is an exemplary embodiment of a transparent substrate after trenches have been cut and filled with a conducting material.
Figure 10D:
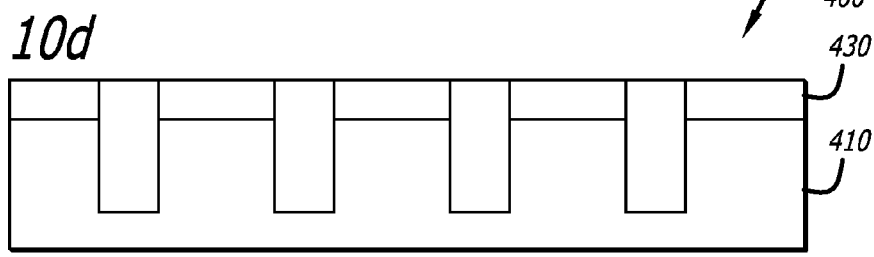
FIG. 10d is an exemplary embodiment of a transparent substrate after trenches have been cut and filled with a conducting material and after a transparent conducting material has been deposited between the trenches.
Figure 11:
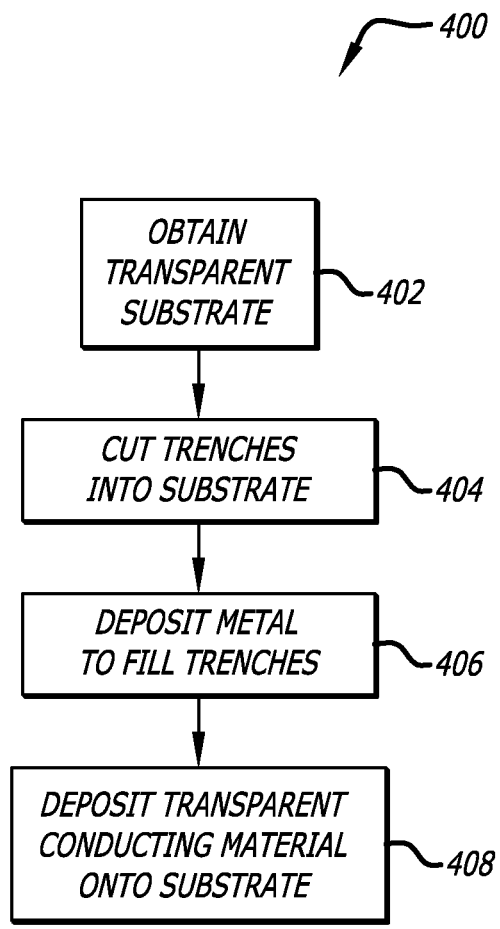
FIG. 11 is a process flow diagram of a method for fabricating an electrode of a solar cell.

A method 400 for fabricating an electrode of an organic solar cell is shown in FIGS. 10a-11, in accordance with the present disclosure. FIG. 10a-10d shows a step by step pictorial representation of the method 400 and FIG. 11 represents the method as a flow diagram.

In operation 402, a substrate 410 without a transparent electrode coated on top is obtained. Trenches 450 are cut in substrate 410 in the same manner as described above for methods 200 and 300 in operation 404. A conductive material, is deposited in operation 406 to fill the trenches 450 and to make the grid or lines 420. The conductive material is deposited so that it rises above the surface of the substrate 410 to a height $h_s$, as shown in FIG. 10c. The conducting material is preferably a metal such as Au, Ag, Al, Cu and the like, and can be deposited by physical deposition or solution process. Whether the grid material is filled in the trenches to a height of hs or flush with the trenches should be determined by which is larger: the width of the trench or 2 times the height hs, so that the one with the larger surface area is chosen for best contact between the grid and electrode. We could simply say that the grid is flush with the substrate or rises to a height of hs, whichever has the highest electrical conductivity between the grid and electrode. Another option is that the grid could rise above the surface of the substrate and then it could also be covered by the electrode. FIGS. 12-15 illustrate a few possible variations.

In operation 408, a transparent conducting material 430 such as a polymer, carbon nanotubes (CNTs) or any other solution processable transparent conducting material 430 is deposited to fill the area between the grid or lines 420. This forms a transparent layer that electrically connects the embedded non-transparent grid or lines 420. The grid or lines 420 go into the substrate 410. It may be desirable to have the grid or lines 420 extend above the top surface of the substrate 410 and electrode 430.

If the top electrode is transparent and has low electrical conductivity because of its relative thinness (10-25 nm), then grids or lines can be placed in contact with the top electrode and embedded in the encapsulating material which will be placed on top of the top electrode. The thickness of the encapsulating material placed on top of the top electrode is between 50-200 μm. These grids or lines in contact with the top electrode should be aligned with the grids in the bottom substrate so that no more light is blocked than is already being blocked by the grids or lines in the substrate. The same factors that were used to determine the size and spacing of the grids or lines in the substrate will be used to determine the size and spacing for these grids or lines.

As discussed above for method 200, the conductive material can be deposited into the trenches 450 by masking and digital spraying or printing.

Some combination of the methods 200, 300 and 400 are also possible.

While the solar cell and method of manufacturing the same have been described in terms of what are presently considered to be the most practical and preferred embodiments, it is to be understood that the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A method for fabricating an electrode of an organic solar cell, the method comprising:
    (i) cutting trenches into a transparent substrate, wherein
        (a) the trenches have a length, a width and a height;
        (b) the trenches are separated by flat segments between trenches, and
        (c) the width of the trenches is less than about 15% of the spacing between adjacent trenches
    and
    (ii) depositing a transparent electrode on the substrate, wherein the transparent electrode fills the trenches completely and rises above the substrate to cover the top of the transparent substrate.

2. The method of claim 1, wherein the transparent electrode is deposited by solution processing.

3. The method of claim 1, wherein the transparent electrode is deposited by one of thermal evaporation and sputtering.

4. The method of claim 3, further comprising polishing the transparent electrode, wherein after polishing the transparent electrode is substantially smooth.

5. The method of claim 1, wherein the trenches are cut into the substrate by one of laser ablation or mechanical removal techniques.

6. The method of claim 1, wherein the height is larger than the width.

7. The method of claim 1, wherein the transparent electrode is a transparent conductive oxide.

8. A method for fabricating an electrode of an organic solar cell, the method comprising:
    (i) providing a transparent substrate;
    (ii) providing a transparent electrode and/or a conducting material; and
    (iii) implementing a process selected from the group consisting of:
        (a) depositing a transparent electrode onto a transparent substrate, cutting trenches into the transparent substrate and deposited transparent electrode, wherein the trenches have a length, a width and a height and wherein the height is larger than the width, and filling the trenches with a conducting material, wherein the trenches are filled to the level of a height of the transparent electrode;
        (b) cutting trenches into the transparent substrate, wherein
            (i) the trenches have a length, a width and a height,
            (ii) the trenches are separated by flat segments between trenches, and
            (iii) the width of the trenches is less than about 15% of the spacing between adjacent trenches;
            and depositing the transparent electrode on the transparent substrate, wherein the transparent electrode fills the trenches completely and rises above the substrate to cover the top of the transparent substrate; and
        (c) cutting trenches into the transparent substrate, wherein the trenches have a length, a width and a height, depositing the conducting material to fill the trenches, wherein the conducting material is deposited in the trenches leaving an area of the substrate exposed and such that the conducting material rises at least to the surface of the substrate, and depositing the transparent electrode onto the transparent substrate and the conducting material filled trenches such that the transparent electrode electrically connects the conducting material filled trenches and covers the area of the substrate exposed between trenches.

* * * * *